US009591950B2

(12) United States Patent
Bem et al.

(10) Patent No.: US 9,591,950 B2
(45) Date of Patent: Mar. 14, 2017

(54) AUTOMATED FLUID DISPENSING SYSTEM

(71) Applicant: BOBRICK WASHROOM EQUIPMENT, INC., North Hollywood, CA (US)

(72) Inventors: Branko Bem, Plano, TX (US); Dikran Babikian, Glendale, CA (US)

(73) Assignee: Bobrick Washroom Equipment, Inc., North Hollywood, CA (US)

( * ) Notice: Subject to any disclaimer, the term of this patent is extended or adjusted under 35 U.S.C. 154(b) by 0 days.

(21) Appl. No.: 14/963,152

(22) Filed: Dec. 8, 2015

(65) Prior Publication Data

US 2016/0088978 A1    Mar. 31, 2016

Related U.S. Application Data

(62) Division of application No. 13/653,939, filed on Oct. 17, 2012, now Pat. No. 9,226,624.

(60) Provisional application No. 61/549,151, filed on Oct. 19, 2011.

(51) Int. Cl.
A47K 5/12          (2006.01)
(52) U.S. Cl.
CPC ................................. *A47K 5/1217* (2013.01)
(58) Field of Classification Search
CPC .. A47K 5/1215; A47K 5/1217; G01S 17/026; G01S 17/88; B67D 7/465; Y10T 307/773; H02J 2007/0067
USPC ......... 222/52, 333, 63, 181.2, 214; 307/117, 307/109; 320/166; 250/338.1; 340/573.1
See application file for complete search history.

(56) References Cited

U.S. PATENT DOCUMENTS

| 3,273,752 A | | 9/1966 | Horeczky | |
|---|---|---|---|---|
| 3,662,924 A | | 5/1972 | Crandall et al. | |
| 3,855,129 A | * | 12/1974 | Abrahams | F04B 11/0058 210/137 |
| 4,450,351 A | * | 5/1984 | Fraden | G01V 8/12 250/221 |
| 4,722,372 A | | 2/1988 | Hoffman et al. | |
| 4,834,150 A | * | 5/1989 | Gadke | B67D 7/32 141/192 |
| 4,911,335 A | | 3/1990 | Stofle et al. | |

(Continued)

FOREIGN PATENT DOCUMENTS

EP      0 3799 118 A1    7/1990
EP      2 008 561 A2    12/2008

OTHER PUBLICATIONS

John F. Wakerly, Digital Design Principles and Practices, Transistor-Transistor-Logic Topics, (4th ed. 2006).*

(Continued)

*Primary Examiner* — Paul R Durand
*Assistant Examiner* — Charles P Cheyney
(74) *Attorney, Agent, or Firm* — Lewis Roca Rothgerber Christie LLP

(57) ABSTRACT

A method for automated dispensing of a fluid. The method includes providing a light pulse to a location proximate a dispensing outlet from which said fluid will be dispensed, sensing a light received from that location, where the sensed light includes at least one of an ambient light or a reflection of said light pulse, generating a signal corresponding to the sensed light, generating a transistor-transistor logic (TTL) signal if the reflection of the light pulse is determined and pumping a fluid to the dispenser outlet in response to said TTL signal.

19 Claims, 3 Drawing Sheets

(56) References Cited

U.S. PATENT DOCUMENTS

| | | | |
|---|---|---|---|
| 4,921,150 A * | 5/1990 | Lagergren | A47K 5/1215 137/624.11 |
| 4,938,384 A | 7/1990 | Pilolla et al. | |
| 4,967,935 A * | 11/1990 | Celest | A47K 5/1217 222/181.2 |
| 5,036,892 A * | 8/1991 | Stembridge | B06B 1/0681 141/1 |
| 5,255,822 A * | 10/1993 | Mease | A47K 5/1202 222/113 |
| 5,305,916 A | 4/1994 | Suzuki et al. | |
| 5,477,984 A | 12/1995 | Sayama et al. | |
| 5,491,333 A * | 2/1996 | Skell | B67D 1/1236 141/95 |
| 5,574,813 A | 11/1996 | Chudoba et al. | |
| 5,823,390 A | 10/1998 | Muderlak et al. | |
| 5,902,998 A * | 5/1999 | Olson | G01S 17/026 235/462.23 |
| 6,209,752 B1 | 4/2001 | Mitchell et al. | |
| 6,604,867 B2 | 8/2003 | Radek et al. | |
| 7,486,386 B1 | 2/2009 | Holcombe et al. | |
| 7,798,373 B1 | 9/2010 | Wroblewski et al. | |
| 7,896,196 B2 | 3/2011 | Wegelin et al. | |
| 2005/0249466 A1 | 11/2005 | Wilson | |
| 2006/0006354 A1 | 1/2006 | Guler et al. | |
| 2006/0018833 A1 | 1/2006 | Murphy et al. | |
| 2009/0066558 A1 | 3/2009 | Ikramov et al. | |
| 2011/0006188 A1 | 1/2011 | Lin | |
| 2014/0234140 A1 * | 8/2014 | Curtis | A47K 5/1217 417/411 |

OTHER PUBLICATIONS

PCT International Search Report and Written Opinion of the International Search Authority mailed Apr. 15, 2014, for International Application No. PCT/US2012/060583 filed Oct. 17, 2012; 11 pages.
International (PCT) Preliminary Report on Patentability mailed May 1, 2014, for International Application PCT/US2012/060583; 8 pages.

* cited by examiner

US 9,591,950 B2

AUTOMATED FLUID DISPENSING SYSTEM

CROSS REFERENCE TO RELATED APPLICATION

This is a divisional application of application Ser. No. 13/653,939, filed Oct. 17, 2012, now U.S. Pat. No. 9,226,624, which is based upon and claims the benefit of U.S. Provisional Application No. 61/549,151 filed on Oct. 19, 2011, the contents of all of which are fully incorporated herein by reference.

BACKGROUND OF THE INVENTION

Automated battery operated liquid soap dispensing systems typically include a dispensing spout having a dispensing opening for dispensing liquid soap or foam (collectively or individually "liquid soap"), which is stored in a reservoir remote from the spout. The liquid soap is pumped to the spout using a pump. Infrared sensing technology using an infrared sensor is typically used to sense a user's hand beneath the dispensing opening of the spout for activating the pump for pumping the liquid soap. Infrared sensors are sensitive to ambient light and in addition require relatively high current to operate. The high sensitivity infrared sensor generates a single pulse via a high powered source such as high output Infra-Red Diode. If a user's hand is beneath the spout, the pulse generated by the source is reflected back by the user's hand to a photo detector. Depending on the strength of the reflected pulse, a microprocessor determines if a hand (or other object) is beneath the spout, and if so, activates the pump for pumping the liquid soap. In some cases, multiple pulses are generated and a plurality of reflected pulses are detected for error determination. If the number of deflected pulses is not within a specified number, the system assumes that a sensing error has occurred. The problem with the current systems is that they are not very robust. The strength of the signals that are reflected at times change due to the ambient light and/or the reflecting surfaces surrounding the spout. Thus, it may take more than a few hand swipes beneath the tip of the dispenser spout in order to activate the pump. At other times, the pump may be activated without a hand moving below the tip as for example when there is a change in the ambient light. A typical IR application uses 50 milliamps current and 10 milliseconds duration time for an IR pulse consuming approximately 500 microamp-hours (μAh). Thus, a more robust power saving and detecting system is desired for battery operated devices.

SUMMARY OF THE INVENTION

In an exemplary embodiment a fluid dispenser is provided. The dispenser includes a dispensing outlet, a fiber optic cable extending to a location proximate the dispensing outlet, a light source for generating a light pulse, the light pulse traveling through the fiber optic cable to the location, a sensor for sensing light received via the fiber optic cable, a microcontroller coupled to the light source and for generating a voltage in response to the light sensed by the sensor, a comparator for comparing voltages generated by the microcontroller and sending a signal to the microcontroller, and a pump for pumping a fluid to the dispenser outlet in response to a signal received from the microcontroller. In another exemplary embodiment, the fiber optic cable is a single core plastic fiber optic cable. In yet another exemplary embodiment, the light source is an infrared LED. In a further exemplary embodiment, the light pulse has a power in the range of 500 to 1000 milliamps. In yet a further exemplary embodiment, the light pulse has a duration of one microsecond or less. In another exemplary embodiment, the fiber optic cable includes at least one end which is not polished. In a further exemplary embodiment, the dispenser also includes a splitter coupled to the fiber optic cable, the sensor and the light source.

In another exemplary embodiment a fluid dispenser is provided. The dispenser includes a dispensing outlet, a first fiber optic cable extending to a location proximate the dispensing outlet, a second fiber optic cable extending to a location proximate the dispensing outlet, a light source for generating a light pulse, the light pulse traveling through the first fiber optic cable to the location, a sensor for sensing light received via the second fiber optic cable, a microcontroller coupled to the light source and for generating a voltage in response to the light sensed by the sensor, a comparator for comparing voltages generated by the microcontroller and sending a signal to the microcontroller, and a pump for pumping a fluid to the dispenser outlet in response to a signal received from the microcontroller. In yet another exemplary embodiment, at least one of the first and second fiber optic cables is a single core plastic fiber optic cable. In a further exemplary embodiment, the light source is an infrared LED. In yet a further exemplary embodiment, the light pulse has a power in the range of 500 to 1000 milliamps. In another exemplary embodiment, the light pulse has a duration of one microsecond or less. In yet another exemplary embodiment, at least one of the first and second fiber optic cables includes at least one end which is not polished.

In a further exemplary embodiment a method for automated dispensing of a fluid including is provided. The method includes sensing ambient light at a location proximate an area in which the fluid will be dispensed, generating a reference voltage in response to the sensed ambient light; sending a signal to the area, sensing a reflection of the signal, generating a second voltage in response to the reflection of the signal, and dispensing the fluid if a difference between the second and reference voltages is greater than a predetermined value. In another exemplary embodiment, sensing ambient light is sensing ambient light that travels through a fiber optic cable. In yet another exemplary embodiment, the fiber optic cable is a single core plastic fiber optic cable. In one exemplary embodiment, the fiber optic cable includes at least one end which is not polished. In another exemplary embodiment, sending a signal includes sending the signal though a fiber optic cable. In yet another exemplary embodiment, sending a signal includes sending and infrared (IR) pulse. In a further exemplary embodiment, generating a reference voltage includes generating a reference voltage with a microcontroller and communicating such reference voltage to an operational amplifier. In yet a further exemplary embodiment, generating a second voltage includes generating the second voltage with a microcontroller and communicating the second voltage to the operational amplifier. In another exemplary embodiment, the method further includes determining the difference between the second and reference voltages at the operational amplifier, generating a signal in response to the difference and communicating the signal to the microcontroller. In yet another exemplary embodiment, dispensing the fluid includes sending a signal from the microprocessor to a driver and sending a signal from the driver to a pumping mechanism for pumping the fluid. In a further exemplary embodiment, sending a signal to the area comprises sending a light pulse having a power in the range of 500 to 1000 milliamps. In yet a further exemplary embodiment, sending a signal to the area comprises sending a light pulse having a duration of one microsecond or less. In another exemplary embodiment, sensing ambient light comprises sensing ambient light at time intervals of 0.6 seconds or less.

DETAILED DESCRIPTION OF THE INVENTION

Figure 1:
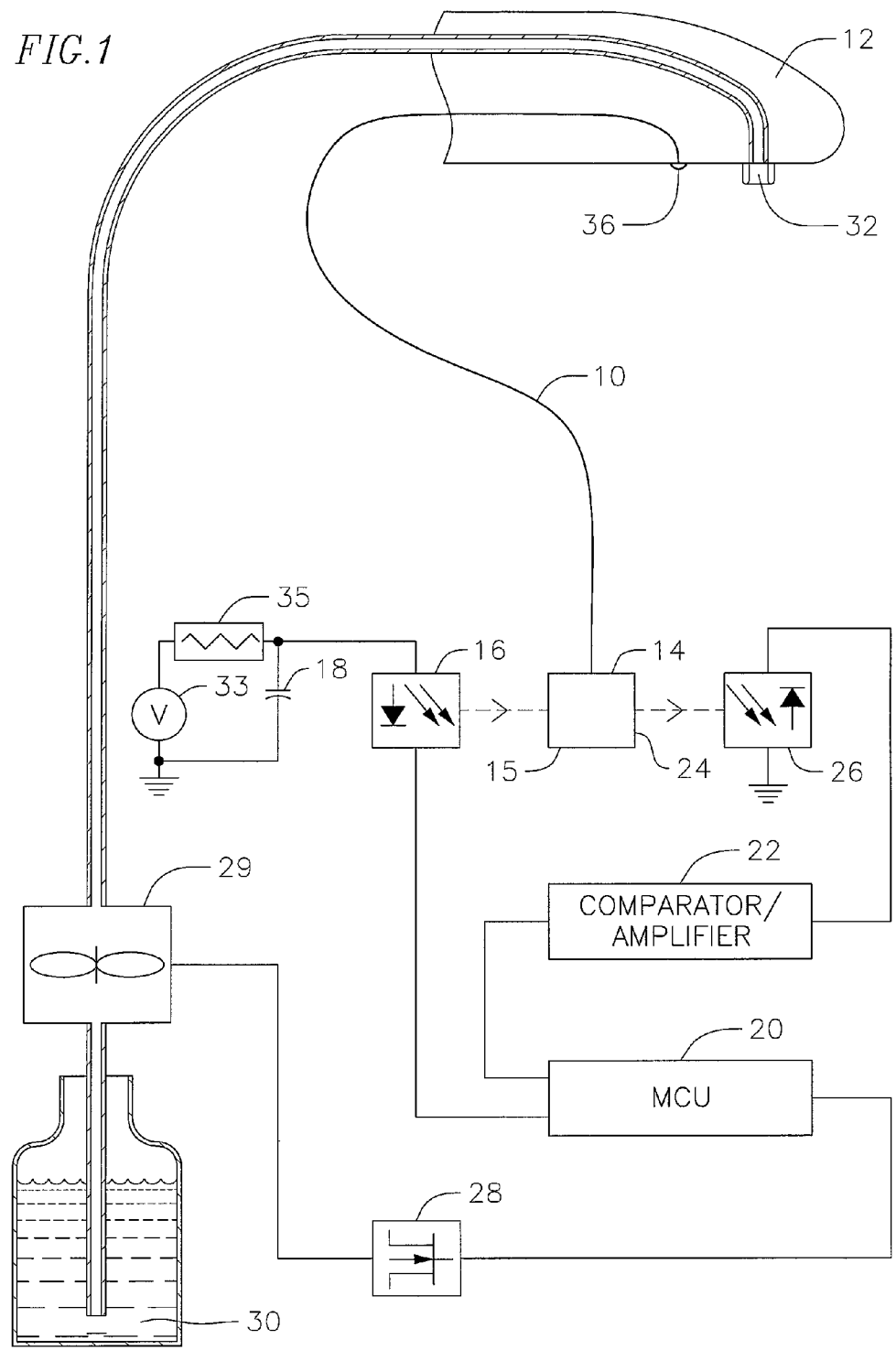
FIG. 1 schematically depicts an exemplary embodiment fluid dispensing system of the present invention.

In an exemplary embodiment, a robust and reliable reflective optical detection system that uses unpolished plastic fiber optics for guiding an IR signal from a remote sensor location is provided. For example, the inventive system may utilize a plastic fiber optic cable whose ends are not polished. An exemplary embodiment system has extremely low power consumption of 1 µAh that uses about 500 times less energy then common IR detection systems while maintaining reliable detection at increased detection distances. Such exemplary embodiment system is ideal for battery operated devices. The exemplary embodiment system may use inexpensive unpolished fiber optic cable(s) and a remote sensor located on a main printed circuit board (PCB) which is insulated from wet environments to prevent damage to sensitive electronics. Low cost of components and assemblies makes it ideal for high volume consumer products. The exemplary system provides for detection and reliable operation at wide environmental condition from complete darkness to full sun light, including wet conditions when fully submerged in water.

In an exemplary embodiment, the invention includes a single-core plastic fiber optic cable 10 that leads from a dispenser spout 12, preferably proximate the tip of the spout, to a splitter 14. In an exemplary embodiment, the fiber optic is unpolished and more specifically the ends of the fiber optic are unpolished. An exemplary splitter is an optical splitter such as mirror or prism or may even be formed by a optical coating. Such coatings are well known in the art. The splitter allows a single cable to be used for both sending a signal and receiving a signal. On an input side 15 of the splitter is attached to a signal source 16, preferably a light source such as an Infra-Red (IR) Source which may be an IR LED. The IR Source in an exemplary embodiment is coupled to a capacitor 18 and to a microcontroller or a microprocessor (collectively or individually referred to herein as "microcontroller" or "MCU") 20 and which is coupled to an operational amplifier, such as a comparator/amplifier 22 ("OpAmp"). An outlet side 24 of the splitter 14 is coupled to a sensor 26, such as an infrared sensor. An exemplary sensor is an IR Diode or an IR Photo Transistor. The sensor is also coupled to the OpAmp 22. The OpAmp is connected to the MCU 20. The MCU is also connected to a driver 28 which is connected to a pumping system 29, for pumping a fluid such as liquid soap from a reservoir 30 to the dispensing spout outlet 32. A low voltage source 33 (as for example a 6 volt source) is connected to the IR Source 16 and the capacitor 18 through a current limiter 35. In an exemplary embodiment, the current limiter limits the current to the capacitor or the IR Source to 50 milliamps. All or some of the components described herein may be formed or attached to a PCB. In addition, although certain components may have been described as discrete separate components, in some embodiments multiple components may be integrated into a single component.

In operation, the sensor 26 is set to sense ambient light surrounding the spout tip 12 received through the end 36 of the fiber optic cable 10 located at the spout at the predetermined time intervals and communicate such sensing by sending a corresponding signal, such as a voltage signal, to the OpAmp 22. An exemplary predetermined time interval is 0.6 second. The signal is a function of the amount of ambient light sensed. In response, the OpAmp 22 amplifies the signal, if and as necessary, and communicates it to the MCU 20 which generates a reference signal, or reference voltage (the "reference voltage"), in response to the signal which is communicated back to the OpAmp 22. An exemplary interval between the ambient light detection and the generation of the signal (e.g. the time it takes for the generation of the signal) is in an exemplary embodiment 1 to 5 milliseconds depending on the strength of the ambient light. This time interval decreases as the strength of the ambient light increases. Moreover, at daylight or when the lights are on in a room where the dispenser is located, the reference voltage generated may be higher than when it is dark or when the lights are off. A few milliseconds after detecting the ambient light, as for example within 1 to 5 milliseconds, the capacitor 18 discharges and causes the IR Source 16 to generate in an exemplary embodiment, a single high power light pulse of 500 to 1000 milliamps having a duration of less than two microseconds. In a preferred exemplary embodiment, the IR Source 16 generates a single high power pulse of 500 to 1000 milliamps having a duration of one microsecond or less. In an exemplary embodiment, the MCU causes the capacitor 18 to discharge upon generation of the reference voltage. The IR light pulse travels from the input side 15 of the splitter 14 through the fiber optic cable 10 and through the tip end 36 of the fiber optic cable. If a reflecting object such as a person's hand is proximate the spout in the field of detection of the fiber optic cable tip end 36, at least a portion of the light pulse would be reflected back from such reflecting object through the fiber optic through the splitter 14 and to the sensor 26. The strength of the reflected light pulse will be detected by the sensor 26 and communicated to the OpAmp. The OpAmp will amplify the detected light pulse, if and as necessary, and communicate it to the MCU. In response the MCU will generate a signal, such as a voltage signal (the "reflected voltage"), and send it back to the OpAmp 22. The generated voltage signal by the MCU is a function of the sensed reflected pulse strength. The OpAmp would compare the reference voltage and the reflected voltage and in response generate a TTL (transistor-transistor logic) signal which is then communicated to the MCU 20. If the difference between the reference voltage and the reflected voltage is greater than a predetermined amount, the OpAmp send a first signal to the MCU. If the difference in voltage between the reference voltage and the reflected voltage is not greater than the predetermined amount, then the OpAmp sends a second signal or not signal to the MCU. If the MCU receives the signal, it then send a signal to the driver 28 to operate the pumping system 29 for pumping the liquid soap (or other fluid) from the reservoir 30 to the dispenser outlet 32. The MCU does not provide a signal to the driver for operating the pumping system when it receives no signal or when it receives the second signal from the OpAmp.

If a user's hand is not in the field of detection of the fiber optic cable to reflect the single pulse, there will not be any reflected signal and the strength of any signal received by the sensor 26 would be that of the ambient light. Consequently, the reflected voltage generated would be same or very close to the initially measured reference voltage. Thus, the difference in the two voltages will be less than the predetermined amount and the OpAmp will generate no signal or the second signal and the MCU would not send a signal to driver 28 to operate the pumping system 29. The process is then repeated as the sensor 26 senses ambient light again within the predetermined time interval.

After the single pulse voltage is sent, the capacitor is recharged from the low voltage source 33 so that it would be ready to send another signal after another ambient light detection has been made by the sensor.

Figure 2:
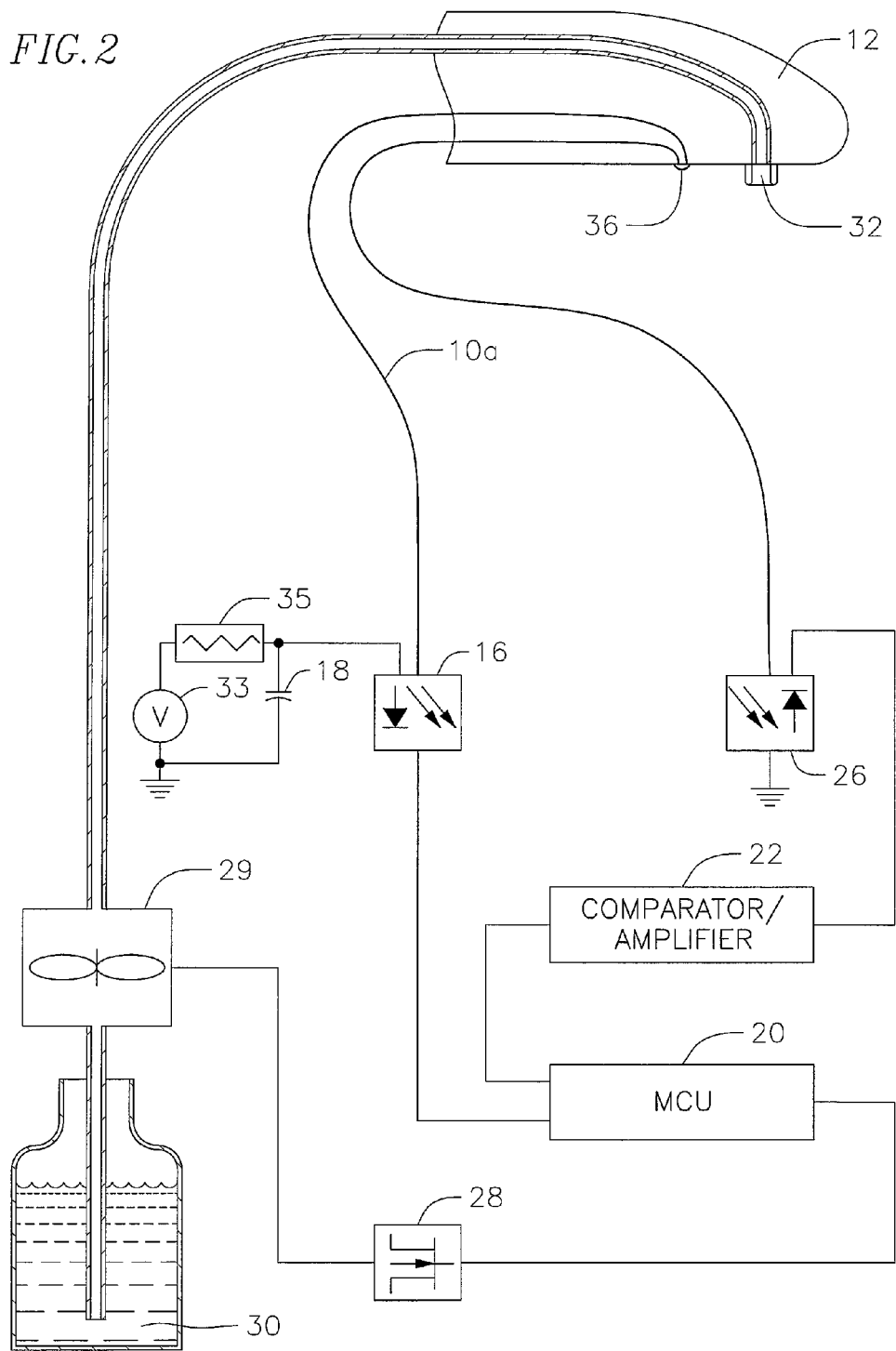
FIG. 2 schematically depicts another exemplary embodiment fluid dispensing system of the present invention.

In another exemplary embodiment as shown in FIG. 2, instead of an optical splitter and a single fiber optic cable, two single core fiber optic plastic cables 10a, 10b may be used. A first fiber optic plastic cable 10a is used for sending a signal and a second fiber optic plastic cable 10b is used for receiving a signal. The IR Source 16 is coupled to the first fiber optic cable 10a through which a signal is sent, while the sensor 26 is coupled to the second fiber optic cable 10b through which a signals is received.

Figure 3:
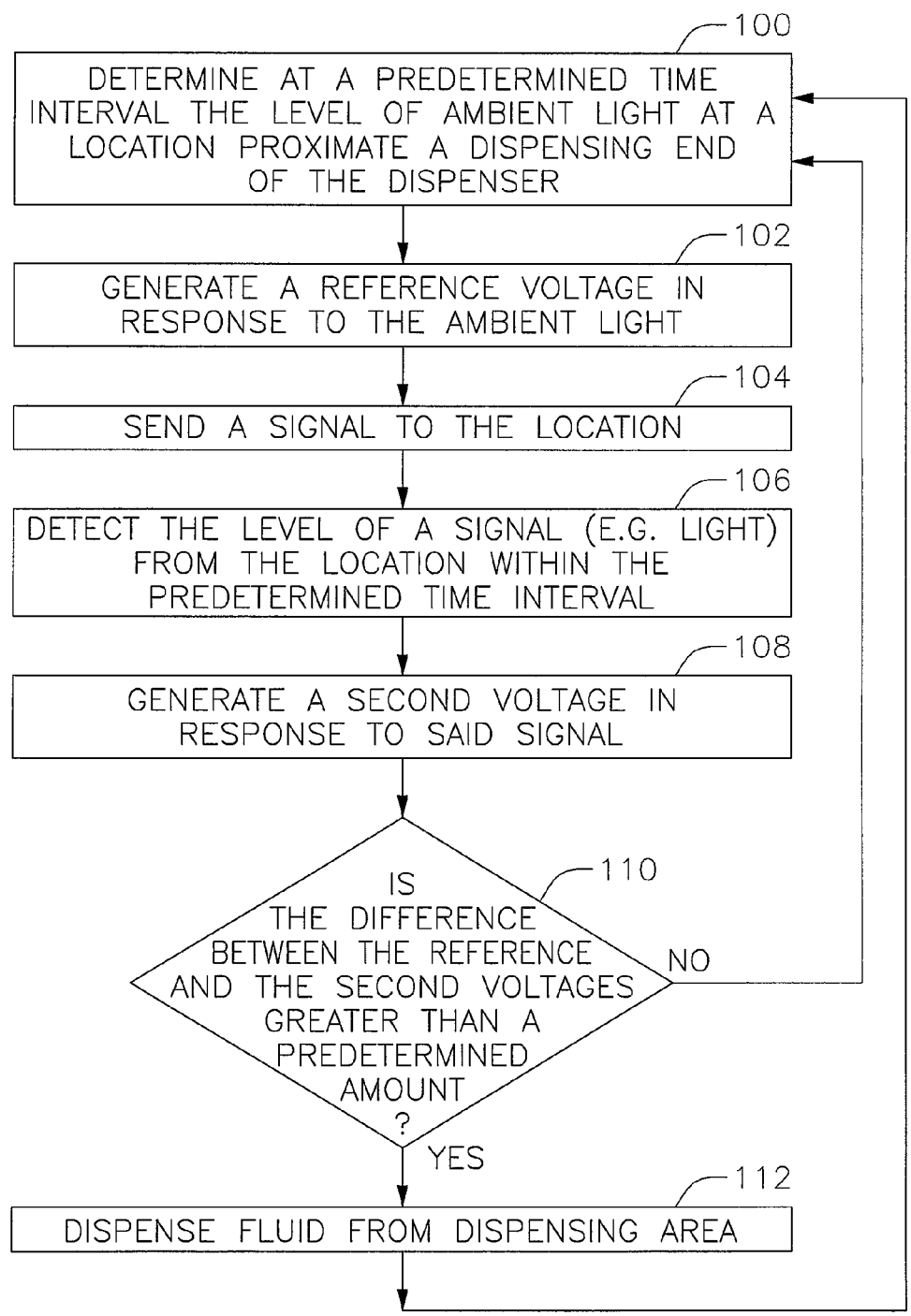
FIG. 3 depicts a flow chart of an exemplary embodiment method of the present invention.

In summary as shown in FIG. 3, the level of ambient light at a location proximate or at a dispensing end of a dispenser is detected at predetermined time intervals (100). A reference voltage is generated in response to the sensed ambient light (102). A signal such as an IR signal is sent to the location proximate or at the dispensing end of the dispenser (104). A level of a signal (e.g., light or a reflection of the IR signal) emanating at the location within the predetermined time interval is detected (106), a second voltage in response to the detected signal or ambient light (108). If the difference between the reference voltage and the second voltage is greater than a predetermined amount (110), then fluid is dispensed from the dispenser (112). The process is then repeated.

As can be seen with the present invention, a lower cost robust activating system is provided. The system has low power consumption, as it does not need a high powered source for generating pulses as the prior art system. It also does not require high quality polished glass single-core or multi-core fiber optic cable. In fact, the present system works with plastic fiber optic cables that are not polished. Applicant has also discovered that the system can operate robustly even when submerged in water. Furthermore, by accounting for the ambient light present, the system significantly reduces, if not alleviates, all the false activations or the mis-activations associated with prior art dispenser activating systems, which do not account for the ambient light. For example, with the prior art systems, if the ambient light is significant, the reflection may be diluted, and thus, the system may not determine that a user is intending to activate the pumping system.

Although the present invention has been described and illustrated in respect to exemplary embodiments, it is to be understood that it is not to be so limited, since changes and modifications may be made therein which are within the full intended scope of this invention as hereinafter claimed. For example, the invention may be practiced in another exemplary embodiment without using a capacitor 18 or with using plastic or glass fiber optic cables whose ends may or may not be polished.

What is claimed is:

1. A method for automated dispensing of a fluid comprising:
   providing a light pulse to a location proximate a dispensing outlet from which said fluid will be dispensed;
   sensing a light received from that location, wherein said light comprises at least one of an ambient light or a reflection of said light pulse;
   generating a signal corresponding to said sensed light;
   determining from said signal if said sensed light comprises a reflection of said light pulse or if said sensed light is ambient light;
   generating a transistor-transistor logic (TTL) signal if the reflection of said light pulse is determined;
   pumping a fluid to said dispenser outlet in response to said TTL signal; and
   discharging a capacitor for generating said light pulse in 5 milliseconds or less after determining that said light is ambient light.

2. The method of claim 1, further comprising amplifying said generated signal corresponding to said sensed light prior to determining from said sensed signal if said sensed light comprises a reflection of said light pulse or if said sensed light is ambient light.

3. The method of claim 2, further comprising generating another signal in response to said TTL signal and wherein pumping a fluid comprises pumping a fluid in response to said another signal.

4. The method of claim 1, further comprising generating another signal in response to said TTL signal and wherein pumping a fluid comprises pumping a fluid in response to said another signal.

5. The method of claim 1, wherein sensing ambient light is sensing ambient light that travels through a fiber optic cable.

6. The method of claim 1, wherein the fiber optic cable is a single core plastic fiber optic cable.

7. The method of claim 1, wherein the fiber optic cable comprises at least one end which is not polished.

8. The method of claim 1, wherein providing a light pulse comprises providing said light pulse though a fiber optic cable.

9. The method of claim 1, wherein providing a light pulse comprises providing an infrared (IR) pulse.

10. The method of claim 1, wherein providing a light pulse to said location comprises providing a light pulse having a power in the range of 500 to 1000 milliamps.

11. The method of claim 10, wherein providing a light pulse to said location comprises providing a light pulse having a duration of one microsecond or less.

12. The method of claim 1, wherein providing a light pulse to said location comprises providing a light pulse having a duration of one microsecond or less.

13. The method of claim 1, wherein providing a light pulse to said location comprises providing a light pulse having a duration of two microseconds or less.

14. The method of claim 1, wherein sensing a light comprises sensing ambient light at time intervals of 0.6 seconds or less.

15. The method of claim 1, wherein discharging a capacitor comprises discharging the capacitor for generating said light pulse within 1 to 5 milliseconds after determining that said light is ambient light.

16. The method of claim 1, further comprising using a comparator for determining from said signal if said sensed light comprises a reflection of said light pulse or if said sensed light is ambient light, and for generating said TTL signal if the reflection of said light pulse is determined.

17. The method of claim 16, further comprising amplifying said generated signal corresponding to said sensed light prior to determining from said sensed signal if said sensed light comprises a reflection of said light pulse or if said sensed light is ambient light.

18. The method of claim 17, further comprising generating another signal in response to said TTL signal and wherein pumping a fluid comprises pumping a fluid in response to said another signal.

19. The method of claim 18, further comprising using a microcontroller separate from said comparator for generating said another signal.

* * * * *

UNITED STATES PATENT AND TRADEMARK OFFICE
CERTIFICATE OF CORRECTION

PATENT NO. : 9,591,950 B2  
APPLICATION NO. : 14/963152  
DATED : March 14, 2017  
INVENTOR(S) : Branko Bem et al.

Page 1 of 1

It is certified that error appears in the above-identified patent and that said Letters Patent is hereby corrected as shown below:

On the Title Page

| | |
|---|---|
| (56) References Cited, Column 2, Foreign Patent Documents, Ref. #1 | Delete "EP 0 3799 118 A1", Insert --EP 0 379 118 A1-- |

In the Claims

| | |
|---|---|
| Column 6, Line 42, Claim 8 | Delete "pulse though", Insert --pulse through-- |

Signed and Sealed this  
Thirteenth Day of November, 2018

Andrei Iancu  
*Director of the United States Patent and Trademark Office*